United States Patent
Schmidt et al.

(10) Patent No.: US 10,770,627 B2
(45) Date of Patent: Sep. 8, 2020

(54) WAVELENGTH CONVERTING MATERIAL FOR A LIGHT EMITTING DEVICE

(71) Applicant: Lumileds Holding B.V., Schiphol (NL)

(72) Inventors: Peter Josef Schmidt, Aachen (DE); Rob Engelen, Eindhoven (NL); Thomas Diederich, Aachen (DE)

(73) Assignee: Lumileds Holding B.V. (NL)

( * ) Notice: Subject to any disclaimer, the term of this patent is extended or adjusted under 35 U.S.C. 154(b) by 0 days.

(21) Appl. No.: 16/342,491

(22) PCT Filed: Sep. 12, 2018

(86) PCT No.: PCT/EP2018/074647
§ 371 (c)(1),
(2) Date: Apr. 16, 2019

(87) PCT Pub. No.: WO2019/063297
PCT Pub. Date: Apr. 4, 2019

(65) Prior Publication Data
US 2020/0227598 A1 Jul. 16, 2020

(30) Foreign Application Priority Data

Sep. 28, 2017 (EP) .................................... 17193745

(51) Int. Cl.
| | |
|---|---|
| *H01L 29/22* | (2006.01) |
| *H01L 31/0256* | (2006.01) |
| *H01L 31/0296* | (2006.01) |
| *H01L 33/50* | (2010.01) |
| *C09K 11/77* | (2006.01) |

(52) U.S. Cl.
CPC ........ *H01L 33/504* (2013.01); *C09K 11/7708* (2013.01); *C09K 11/7774* (2013.01)

(58) Field of Classification Search
CPC .............. H01L 33/504; C09K 11/7708; C09K 11/7774
USPC .......................................................... 257/79
See application file for complete search history.

(56) References Cited

U.S. PATENT DOCUMENTS

| 8,323,528 B1 | 12/2012 | Jia et al. |
| 2015/0357532 A1 | 12/2015 | Onuma et al. |

FOREIGN PATENT DOCUMENTS

| DE | 10 2007 001903 A1 | 5/2008 | |
| JP | 08288582 H | 11/1996 | |
| WO | WO-2009053876 A2 * | 4/2009 | ......... A61K 49/0065 |
| WO | 2009/134507 A2 | 11/2009 | |

OTHER PUBLICATIONS

International Search Report corresponding to PCT/EP2018/074647, dated Nov. 8, 2018, 4 pages.

* cited by examiner

*Primary Examiner* — David S Blum

(57) ABSTRACT

Embodiments of the invention include an infrared-emitting phosphor comprising $(La,Gd)_3Ga_{5-x-y}Al_xSiO_{14}:Cr_y$, where $0 \le x \le 1$ and $0.02 \le y \le 0.08$. In some embodiments, the infrared-emitting phosphor is a calcium gallogermanate material. In some embodiments, the infrared-emitting phosphor is used with a second infrared-emitting phosphor. The second infrared-emitting phosphor is one or more chromium doped garnets of composition $Gd_{3-x1}Sc_{2-x2-y}Lu_{x1+x2}Ga_3O_{12}:Cr_y$, where $0.02 \le x1 \le 0.25$, $0.05 \le x2 \le 0.3$ and $0.04 \le y \le 0.12$.

17 Claims, 7 Drawing Sheets

WAVELENGTH CONVERTING MATERIAL FOR A LIGHT EMITTING DEVICE

CROSS REFERENCE TO RELATED APPLICATIONS

This patent application is a U.S. National Phase application under 35 U.S.C. 371 of International Patent Application No. PCT/EP2018/074647 titled "Wavelength Converting Material for a Light Emitting Device" and filed Sep. 12, 2018, which claims benefit of priority to European Patent Application 17193745.1 titled "Wavelength Converting Material for a Light Emitting Device" and filed Sep. 28, 2017, both of which are incorporated herein by reference in their entirety.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

A light emitting device such as an LED is often combined with a wavelength converting material such as a phosphor. Such devices are often referred to as phosphor-converted LEDs, or PCLEDs.

DETAILED DESCRIPTION

Figure 1:
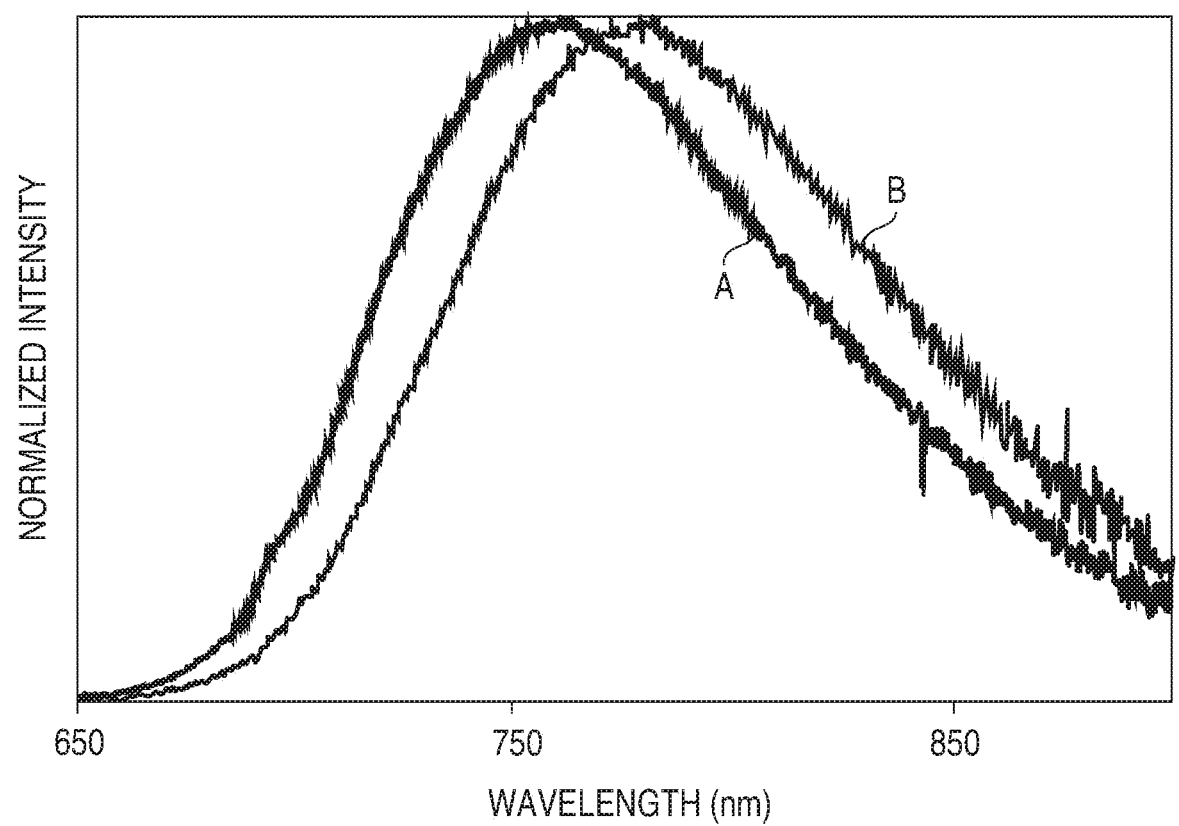
FIG. 1 illustrates the emission spectra of two near-infrared emitting phosphors according to some embodiments.

Embodiments of the invention include wavelength-converting materials or luminescent materials such as phosphors that emit near-infrared (NIR) radiation. For economy of language, infrared radiation may be referred to herein as "light." The NIR phosphors may be used, for example, in phosphor-converted LEDs.

The NIR phosphors may emit light having a peak wavelength of at least 700 nm in some embodiments and no more than 1100 nm in some embodiments. The NIR phosphors may have a distributed emission intensity within the 700-1100 nm range; for example, in some embodiments, the NIR phosphors may have a full width at half maximum of at least 1700 $cm^{-1}$ in some embodiments and no more than 4000 $cm^{-1}$ in some embodiments.

The NIR phosphors may be excited, for example, by light in the visible spectral range, meaning that they absorb visible light, and in response, emit NIR light. The NIR phosphors may be wide band gap materials. Use of wide band gap host lattices may limit luminescence quenching at elevated temperatures due to photoionization. The band gap of the NIR phosphors may be at least 4.8 eV in some embodiments, greater than 5 eV in some embodiments, and less than 7 eV in some embodiments.

In some embodiments, the NIR phosphors are electrically insulating materials. One benefit of electrically insulating materials may be higher band gap, as electrical conductivity is related to band gap. The higher the band gap, the lower the electrical conductivity. In addition, semiconductors often show increased conductivity at higher temperatures, while an insulator such as diamond (band gap ~5.5 eV, comparable with the band gap of NIR phosphors according to some embodiments) remains insulating even at increased temperature.

Wavelength converting materials such as phosphors typically include a host lattice and at least one dopant species. The atoms of the dopant species function as light emitting centers. In some embodiments, the NIR phosphors include trivalent cations such as Cr(III) (Cr(III) is the same as $Cr^{3+}$) as emitting centers. In some embodiments, in addition to or instead of trivalent cations, the NIR phosphors include tetravalent cations as emitting centers. In some embodiments, the host lattice includes a tetravalent cation such as $Si^{4+}$ with an effective ionic radius for fourfold coordination that is 38% smaller than the effective ionic radius of $Cr^{4+}$. The small tetravalent host lattice cation size may suppress the formation of unwanted Cr(IV), which may improve the stability of the NIR phosphors and may increase the luminescence conversion efficiency of the NIR phosphors at elevated temperatures. The NIR phosphors of the invention contain less than 1% Cr(IV), relative to the total chromium content in the NIR phosphor, to reduce or eliminate self-absorption losses, where emitted light is reabsorbed in the phosphor material. Self-absorption loss may occur because of the overlap of the Cr(III) emission band and the Cr(IV) absorption band. Most of the emission energy is transferred into heat, which may reduce efficiency.

The low concentrations of Cr(IV) required in some embodiments cannot be easily reached in other phosphors, such as $La_3Ga_5GeO_{14}$:Cr, which do not include a small radius tetravalent cation in the host lattice, because the larger sized $Ge^{4+}$ cation has the same size as $Cr^{4+}$ within 5%, thus the $Cr^{4+}$ is stabilized in the structure. In such phosphors, expensive workarounds like reductive firing under elevated pressures are needed to suppress e.g. gallium loss. NIR phosphors according to some embodiments include $Si^{4+}$, which is much smaller than $Ge^{4+}$ and $Cr^{4+}$. Accordingly, techniques such as the above-described reductive firing are not required to prevent $Cr^{4+}$ incorporation on the $Si^{4+}$ site.

In addition, the inclusion of Cr(IV) in, for example, $La_3Ga_5GeO_{14}$:Cr also leads to pronounced afterglow (a low intensity, persistent emission that is undesirable in applications where short light pulses with constant spectral power distributions are needed), and a shift of the emission spectrum towards longer wavelengths if Cr(IV) is directly excited with red light. The afterglow phenomenon can be enhanced by doping the $La_3Ga_5GeO_{14}$:Cr material further with divalent cations, which may stabilize Cr(IV) in the structure. NIR phosphors according to some embodiments do not include divalent cations, such as, for example, $Mg^{2+}$ as dopants. NIR phosphors according to some embodiments do not include tetravalent cations in the host lattice that undesirably stabilize Cr(IV), such as, for example, $Ge^{4+}$.

In some embodiments, the NIR phosphor has a host lattice belonging to the calcium gallogermanate structure family crystallizing in the polar space group P321. The host lattice may crystallize in a trigonal calcium gallogermanate structure type. Suitable calcium gallogermanate materials may have a compositional range $RE_3Ga_{5-x-y}A_xSiO_{14}$:$Cr_y$ (RE=La, Nd, Gd, Yb, Tm; A=Al, Sc), where $0 \leq x \leq 1$ and $0.005 \leq y \leq 0.1$.

In some embodiments, the NIR phosphor has a calcium gallogermanate, garnet, or colquiirite crystal structure host lattice including a quantity of divalent trace metals like Mg, Ca, Yb, Sr, Eu, Ba, Zn, Cd. The concentration of divalent trace metals is kept low, less than 400 ppm in some embodiments and less than 100 ppm in some embodiments. Small divalent trace metals, such as Mg, Zn, and Cd, may substitute for gallium in the $RE_3Ga_{5-x-y}A_xSiO_{14}$:$Cr_y$ material described above. In some embodiments, the NIR phosphor is $La_3Ga_{5-y}SiO_{14}$:$Cr_y$, also known as Langasite, which shows an optical band gap at 5.1 eV. In some embodiments, the NIR phosphor is one or more gallogermanate compounds of composition $RE_3Ga_{5-x-y}A_xSiO_{14}$:$Cr_y$, which show optical band gaps larger than 4.6 eV. In some embodiments, the optical band gap of a gallogermanate material may be increased by partial substitution of Ga by Al and/or Sc, and/or by replacing part of the La by the smaller rare earth elements Nd, Gd, and Yb. The replacement of Ga by Al and/or Sc may further improve the efficiency of the phosphor material, especially at higher temperatures. $Nd^{3+}$ and $Yb^{3+}$ show additional emission in the 950-1070 nm wavelength range which can be beneficial for certain applications.

In some embodiments, the NIR phosphor $RE_3Ga_{5-x-y}A_xSiO_{14}$:$Cr_y$ (RE=La, Nd, Gd, Yb, Tm; A=Al, Sc) is combined with a second, wide band gap, NIR phosphor material such as one or more chromium doped garnets of composition $Gd_{3-x}RE_xSc_{2-y-z}Ln_yGa_{3-w}Al_wO_{12}$:$Cr_z$ (Ln=Lu, Y, Yb, Tm; RE=La, Nd), where $0 \leq x \leq 3$; $0 \leq y \leq 1.5$; $0 \leq z \leq 0.3$; and $0 \leq w \leq 2$, and/or one or more chromium doped colquiirite materials of composition $AAEM_{1-x}F_6$:$Cr_x$ (A=Li, Cu; AE=Sr, Ca;M=Al, Ga, Sc) where $0.005 \leq x \leq 0.2$, and/or one or more chromium doped tungstate materials of composition $A_{2-x}(WO_4)_3$:$Cr_x$ (A=Al, Ga, Sc, Lu, Yb) where $0.003 \leq x \leq 0.5$.

In some embodiments, the NIR phosphor may have a compositional range $(La,Gd)_3Ga_{5-x-y}Al_xSiO_{14}$:$Cr_y$, where $0 \leq x \leq 1$ and $0.02 \leq y \leq 0.08$. In some embodiments, the NIR phosphor $(La,Gd)_3Ga_{5-x-y}Al_xSiO_{14}$:$Cr_y$ is combined with a second, wide band gap, NIR phosphor material such as one or more chromium doped garnets of composition $Gd_{3-x1}Sc_{2-x2-y}Lu_{x1+x2}Ga_3O_{12}$:$Cr_y$, where $0.02 \leq x1 \leq 0.25$, $0.05 \leq x2 \leq 0.3$ and $0.04 \leq y \leq 0.12$.

FIG. 1 illustrates the emission spectra of two NIR phosphor powders according to some embodiments. The materials in FIG. 1 are chromium doped garnets. Curve A is the emission spectrum of $Gd_{2.8}La_{0.2}Sc_{1.7}Lu_{0.2}Ga_3O_{12}$:$Cr_{0.1}$ when excited by 440 nm light. Curve B is the emission spectrum of $Gd_{2.4}La_{0.6}Sc_{1.5}Lu_{0.4}Ga_3O_{12}$:$Cr_{0.1}$ when excited by 440 nm light. The synthesis of these materials is described below in the Examples.

The NIR phosphors according to some embodiments may have advantages over known phosphor systems such as, for example, higher absorption and increased quantum efficiency at elevated temperatures (for example, greater than 25° C. and no more than 85° C. in some embodiments), especially in the wavelength range >800 nm.

The NIR phosphor materials described above can be manufactured, for example, in powder form, in ceramic form, or in any other suitable form. The NIR phosphor materials may be formed into a structure that is formed separately from and can be handled separately from the light source, such as a prefabricated glass or ceramic tile, or may be formed into a structure that is formed in situ with the light source, such as a conformal or other coating formed on or above the light source.

In some embodiments, the NIR phosphors described above may be powders that are dispersed for example in a transparent matrix, a glass matrix, a ceramic matrix, or any other suitable material or structure. The NIR phosphor dispersed in a matrix may be, for example, singulated or otherwise formed into a tile that is disposed over a light source. The glass matrix may be for example a low melting glass with a softening point below 1000° C., or any other suitable glass or other transparent material. In some embodiments, the low melting glass belongs to the family of zinc bismuth borate glasses with a softening point below 600° C. and a refractive index larger than 1.75. In some embodiments, the low melting glass may further comprise barium and/or sodium, a softening point below 500° C. and a refractive index larger than 1.8. The ceramic matrix material can be for example a fluoride salt such as $CaF_2$ or any other suitable material.

The NIR phosphors described above may be used in powder form, for example by mixing the powder phosphor with a transparent material such as silicone and dispensing or otherwise disposing the mixture in a path of light from the light source. In powder form, the average particle size (for example, particle diameter) of the NIR phosphors may be at least 1 μm in some embodiments, no more than 50 μm in some embodiments, at least 5 μm in some embodiments, and no more than 20 μm in some embodiments. Individual NIR phosphor particles, or NIR powder phosphor layers, may be coated with one or more materials such as a silicate, a phosphate, and/or one or more oxides in some embodiments, for example to improve absorption and luminescence properties and/or to increase the material's functional lifetime.

Figure 2:
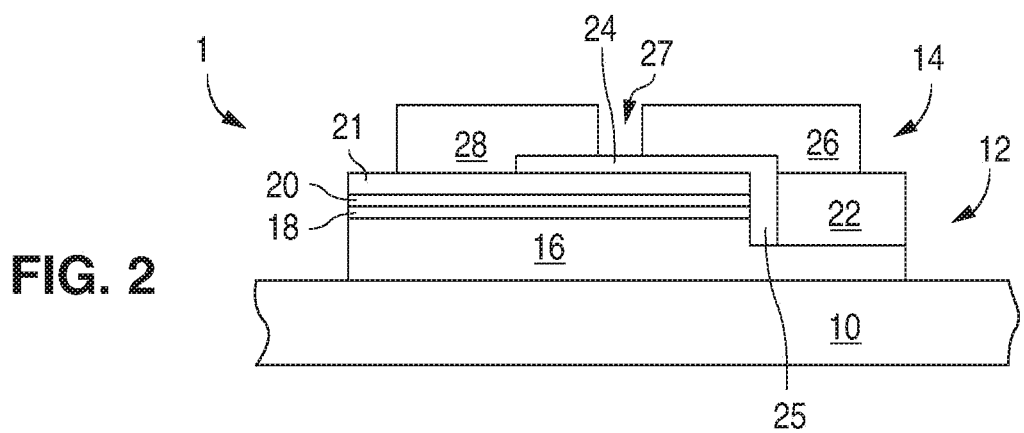
FIG. 2 is a cross sectional view of an LED.

The NIR phosphors described above may be used, for example, in a light source including a light emitting diode (LED). Light emitted by the light emitting diode is absorbed by the phosphor according to embodiments of the invention and emitted at a different wavelength. FIG. 2 illustrates one example of a suitable light emitting diode, a III-nitride LED that emits blue light.

Though in the example below the semiconductor light emitting device is a III-nitride LED that emits blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used. In particular, the NIR phosphors described above may be pumped by, for example, light sources such as LEDs emitting either in the blue (420-470 nm) or in the red (600-670 nm) wavelength range.

FIG. 2 illustrates a III-nitride LED 1 that may be used in embodiments of the present invention. Any suitable semiconductor light emitting device may be used and embodiments of the invention are not limited to the device illustrated in FIG. 2. The device of FIG. 2 is formed by growing a III-nitride semiconductor structure on a growth substrate 10 as is known in the art. The growth substrate is often sapphire but may be any suitable substrate such as, for example, SiC, Si, GaN, or a composite substrate. A surface of the growth substrate on which the III-nitride semiconductor structure is grown may be patterned, roughened, or textured before growth, which may improve light extraction from the device. A surface of the growth substrate opposite the growth surface (i.e. the surface through which a majority of light is extracted in a flip chip configuration) may be patterned, roughened or textured before or after growth, which may improve light extraction from the device.

The semiconductor structure includes a light emitting or active region sandwiched between n- and p-type regions. An n-type region 16 may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region 18 is grown over the n-type region. Examples of suitable light emitting regions include a single thick or thin light emitting layer, or a multiple quantum well light emitting region including multiple thin or thick light emitting layers separated by barrier layers. A p-type region 20 may then be grown over the light emitting region. Like the n-type region, the p-type region may include multiple layers of different composition, thickness, and dopant concentration, including layers that are not intentionally doped, or n-type layers.

After growth, a p-contact is formed on the surface of the p-type region. The p-contact 21 often includes multiple conductive layers such as a reflective metal and a guard metal which may prevent or reduce electromigration of the reflective metal. The reflective metal is often silver but any suitable material or materials may be used. After forming the p-contact 21, a portion of the p-contact 21, the p-type region 20, and the active region 18 is removed to expose a portion of the n-type region 16 on which an n-contact 22 is formed. The n- and p-contacts 22 and 21 are electrically isolated from each other by a gap 25 which may be filled with a dielectric such as an oxide of silicon or any other suitable material. Multiple n-contact vias may be formed; the n- and p-contacts 22 and 21 are not limited to the arrangement illustrated in FIG. 2. The n- and p-contacts may be redistributed to form bond pads with a dielectric/metal stack, as is known in the art.

In order to form electrical connections to the LED 1, one or more interconnects 26 and 28 are formed on or electrically connected to the n- and p-contacts 22 and 21. Interconnect 26 is electrically connected to n-contact 22 in FIG. 5. Interconnect 28 is electrically connected to p-contact 21. Interconnects 26 and 28 are electrically isolated from the n- and p-contacts 22 and 21 and from each other by dielectric layer 24 and gap 27. Interconnects 26 and 28 may be, for example, solder, stud bumps, gold layers, or any other suitable structure.

The substrate 10 may be thinned or entirely removed. In some embodiments, the surface of substrate 10 exposed by thinning is patterned, textured, or roughened to improve light extraction. Any suitable light emitting device may be used in light sources according to embodiments of the invention. The invention is not limited to the particular LED illustrated in FIG. 2. The light source, such as, for example, the LED illustrated in FIG. 2, is illustrated in the following figures by block 1.

Figure 3:
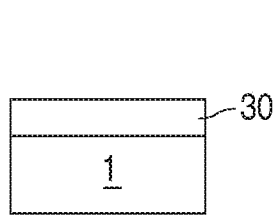
FIG. 3 is a cross sectional view of a device with a wavelength converting structure in direct contact with an LED.
Figure 4:
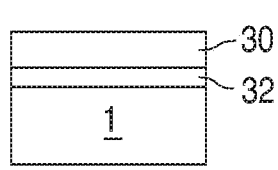
FIG. 4 is a cross sectional view of a device with a wavelength converting structure in close proximity to an LED.
Figure 5:
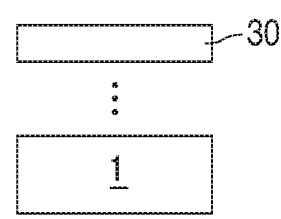
FIG. 5 is a cross sectional view of a device with a wavelength converting structure spaced apart from an LED.

FIGS. 3, 4, and 5 illustrate devices that combine an LED 1 and a wavelength converting structure 30. The wavelength converting structure 30 may include one or more NIR phosphors, according to the embodiments and examples described above.

In FIG. 3, the wavelength converting structure 30 is directly connected to the LED 1. For example, the wavelength converting structure may be directly connected to the substrate 10 illustrated in FIG. 2, or to the semiconductor structure, if the substrate 10 is removed.

In FIG. 4, the wavelength converting structure 30 is disposed in close proximity to LED 1, but not directly connected to the LED 1. For example, the wavelength converting structure 30 may be separated from LED 1 by an adhesive layer 32, a small air gap, or any other suitable structure. The spacing between LED 1 and the wavelength converting structure 30 may be, for example, less than 500 μm in some embodiments.

In FIG. 5, the wavelength converting structure 30 is spaced apart from LED 1. The spacing between LED 1 and the wavelength converting structure 30 may be, for example, on the order of millimeters in some embodiments. Such a device may be referred to as a "remote phosphor" device.

The wavelength converting structure 30 may be square, rectangular, polygonal, hexagonal, circular, or any other suitable shape. The wavelength converting structure may be the same size as LED 1, larger than LED 1, or smaller than LED 1.

Multiple wavelength converting materials and multiple wavelength converting structures can be used in a single device. Examples of wavelength converting structures include luminescent ceramic tiles; powder phosphors that are disposed in transparent material such as silicone or glass that is rolled, cast, or otherwise formed into a sheet, then singulated into individual wavelength converting structures; wavelength converting materials such as powder phosphors that are disposed in a transparent material such as silicone that is formed into a flexible sheet, which may be laminated or otherwise disposed over an LED 1, wavelength converting materials such as powder phosphors that are mixed with a transparent material such as silicone and dispensed, screen printed, stenciled, molded, or otherwise disposed over LED 1; and wavelength converting materials that are coated on LED 1 or another structure by electrophoretic, vapor, or any other suitable type of deposition.

A device may also include other wavelength converting materials in addition to the NIR phosphors described above, such as, for example, conventional phosphors, organic phosphors, quantum dots, organic semiconductors, II-VI or III-V semiconductors, II-VI or III-V semiconductor quantum dots or nanocrystals, dyes, polymers, or other materials that luminesce.

The wavelength converting materials absorb light emitted by the LED and emit light of one or more different wavelengths. Unconverted light emitted by the LED is often part of the final spectrum of light extracted from the structure, though it need not be. Wavelength converting materials emitting different wavelengths of light may be included to tailor the spectrum of light extracted from the structure as desired or required for a particular application.

Multiple wavelength converting materials may be mixed together or formed as separate structures.

In some embodiments, other materials may be added to the wavelength converting structure or the device, such as, for example, materials that improve optical performance, materials that encourage scattering, and/or materials that improve thermal performance.

EXAMPLES

1. Synthesis of $La_3Ga_{4.98}SiO_{14}:Cr_{0.02}$.

Figure 6:
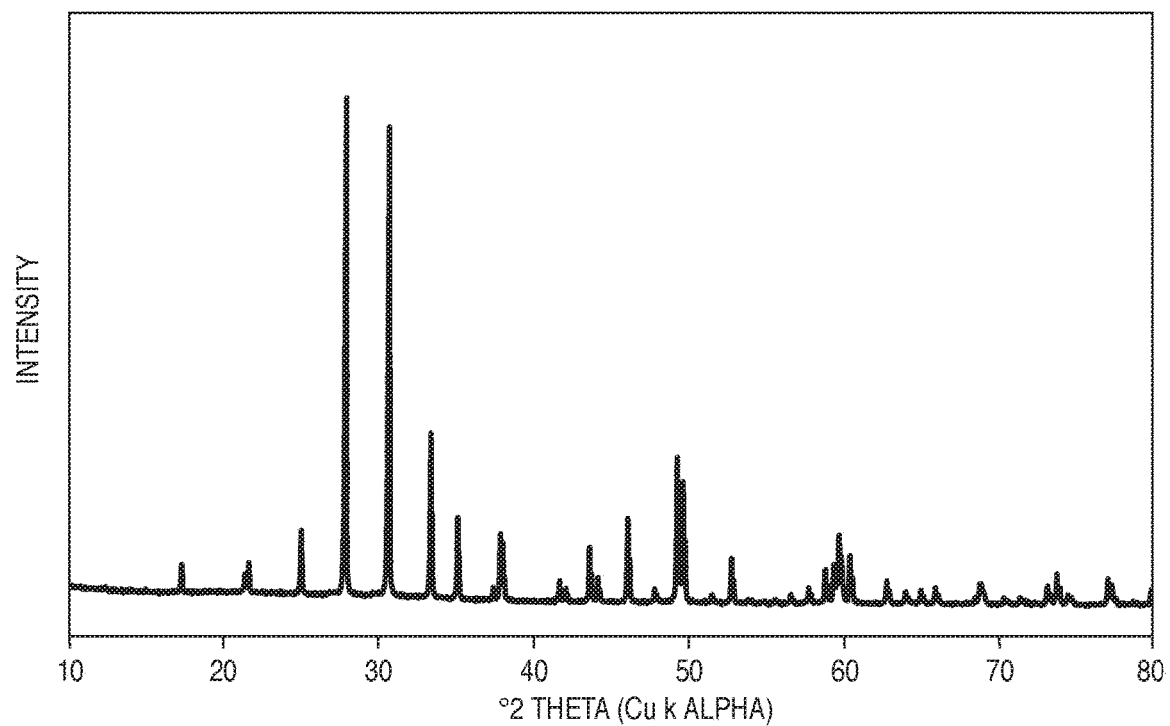
FIG. 6 is an X-ray diffraction (XRD) pattern of synthesized $La_3Ga_{4.98}SiO_{14}:Cr_{0.02}$.

The starting materials 4.805 g lanthanum oxide (Auer Remy, 4N), 4.589 g gallium oxide (Alfa, 5N), 0.0149 g chromium (III) oxide (Alfa, 99%), 0.591 g fumed silica (Evonik) and 0.1 g boric acid (Aldrich) are mixed in ethanol, dried at 100° C. and fired under carbon monoxide at 1300° C. for 4 hrs. After ball milling, the powder is washed with water, dried and sieved. Single phase $La_3Ga_{4.98}SiO_{14}:Cr_{0.02}$ is obtained. FIG. 6 is an X-ray diffraction (XRD) pattern of the synthesized $La_3Ga_{4.98}SiO_{14}:Cr_{0.02}$, crystallizing in the calcium gallogermanate structure with $a_0=8.163$ Å and $C_0=5.087$ Å.

2. Synthesis of $La_3Ga_{4.48}Al_{0.5}SiO_{14}:Cr_{0.02}$.

Figure 7:
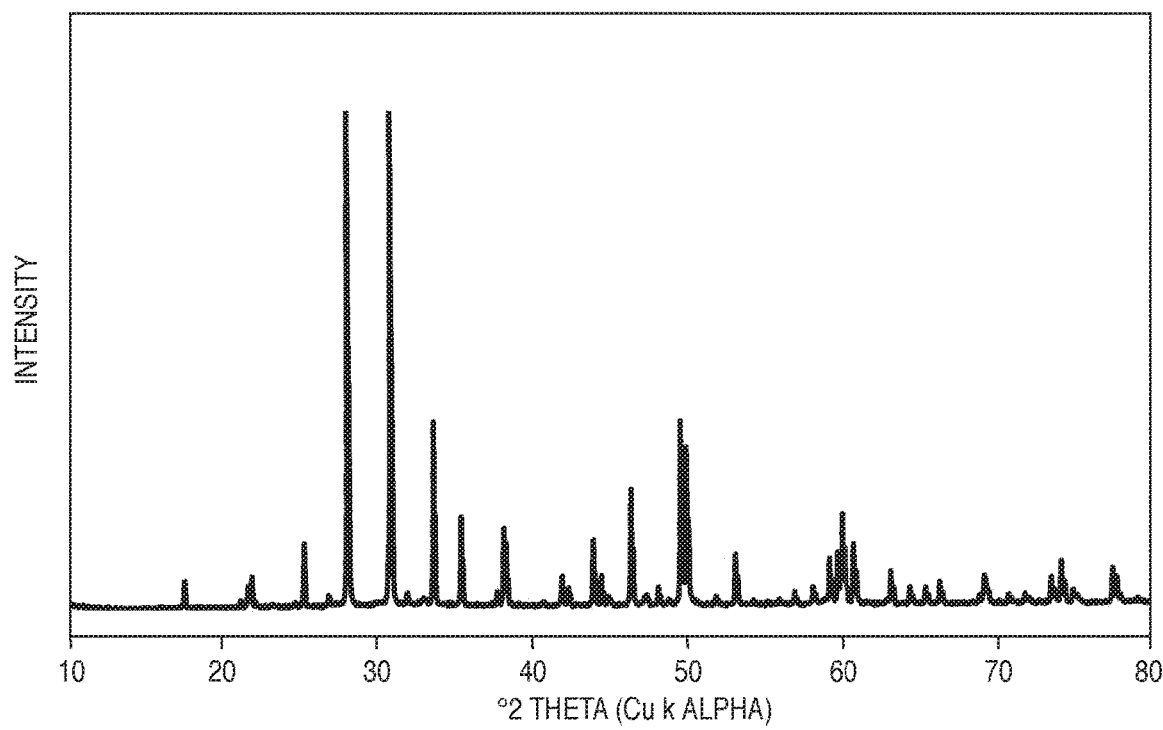
FIG. 7 is an XRD pattern of synthesized $La_3Ga_{4.48}Al_{0.5}SiO_{14}:Cr_{0.02}$.

The starting materials 9.8182 g lanthanum oxide (Auer Remy, 4N), 8.4354 g gallium oxide (Molycorp, UHP grade), 0.0314 g chromium (III) oxide (Alfa, 99%), 1.208 g fumed silica (Evonik), 0.5136 g alumina (Baikowski) and 0.2005 g boric acid (Aldrich) are mixed in ethanol, dried at 100° C. and fired under carbon monoxide at 1320° C. for 4 hrs. and under forming gas at 1000° C. for another 4 hrs. After ball milling, the powder is washed with water, dried and sieved. FIG. 7 is an XRD pattern of the synthesized $La_3Ga_{448}Al_{0.5}SiO_{14}:Cr_{0.02}$, crystallizing in the calcium gallogermanate structure with $a_0=8.146$ Å and $c_0=5.075$ Å.

2.1. Synthesis of $La_{2.98}Gd_{0.02}Ga_{4.76}Al_{0.2}SiO_{14}:Cr_{0.04}$.

Figure 14:
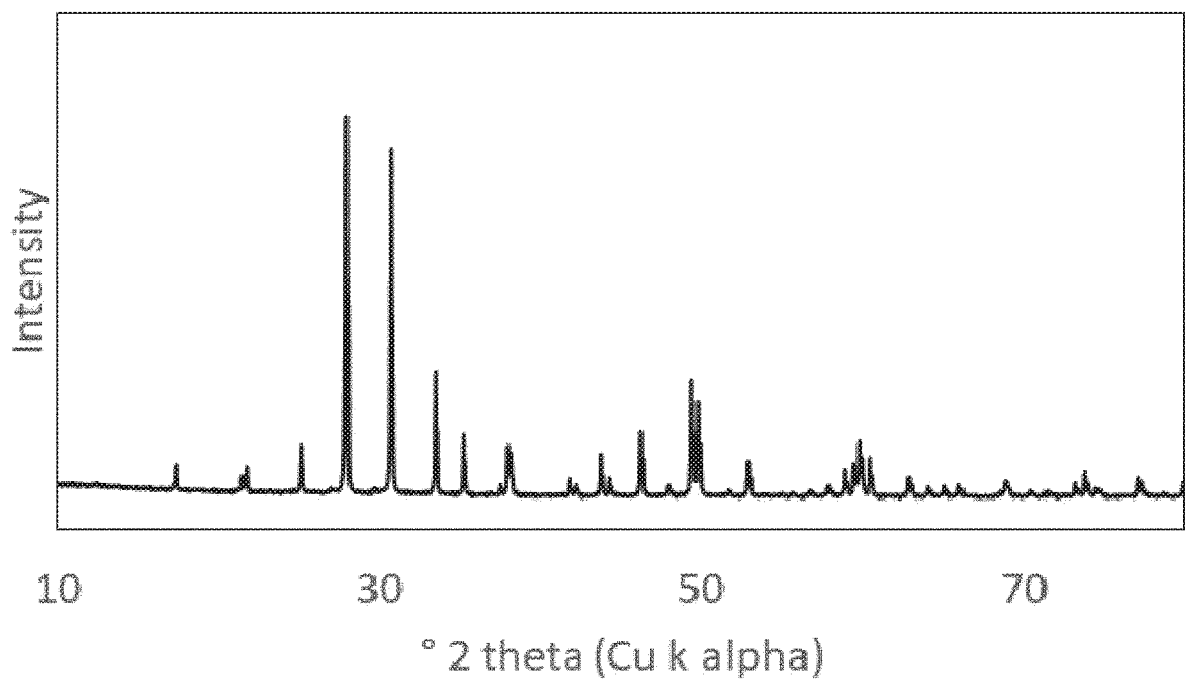
FIG. 14 is an X-ray diffraction (XRD) pattern of the synthesized $La_{2.89}Gd_{0.02}Ga_{4.76}Al_{0.2}SiO_{14}:Cr_{0.04}$.

The starting materials 59.262 g lanthanum oxide (Auer Remy, 4N), 54.769 g gallium oxide (Molycorp, UHP grade), 0.369 g chromium (III) oxide (Materion, 2N5), 7.6 g fumed silica (Evonik), 1.24 g aluminum oxide (Baikowski, SP-DBM) and 0.52 g gadolinium fluoride (Materion, >2N) are mixed in ethanol by ball milling, dried at 100° C. and fired under flowing nitrogen at 1320° C. for 8 hrs. (heating and cooling rampls: 200 K/h). After ball milling, the powder is washed with water, dried and sieved. FIG. 14 is an X-ray diffraction (XRD) pattern of the synthesized $La_{2.89}Gd_{0.02}Ga_{4.76}Al_{0.2}SiO_{14}:Cr_{0.04}$, crystallizing in the calcium gallogermanate structure with $a_0=8.1595$ Å and $c_0=5.0871$ Å.

3. Synthesis of $Gd_{2.8}La_{0.2}Sc_{1.7}Lu_{0.2}Ga_3O_{12}:Cr_{0.1}$.

Figure 8:
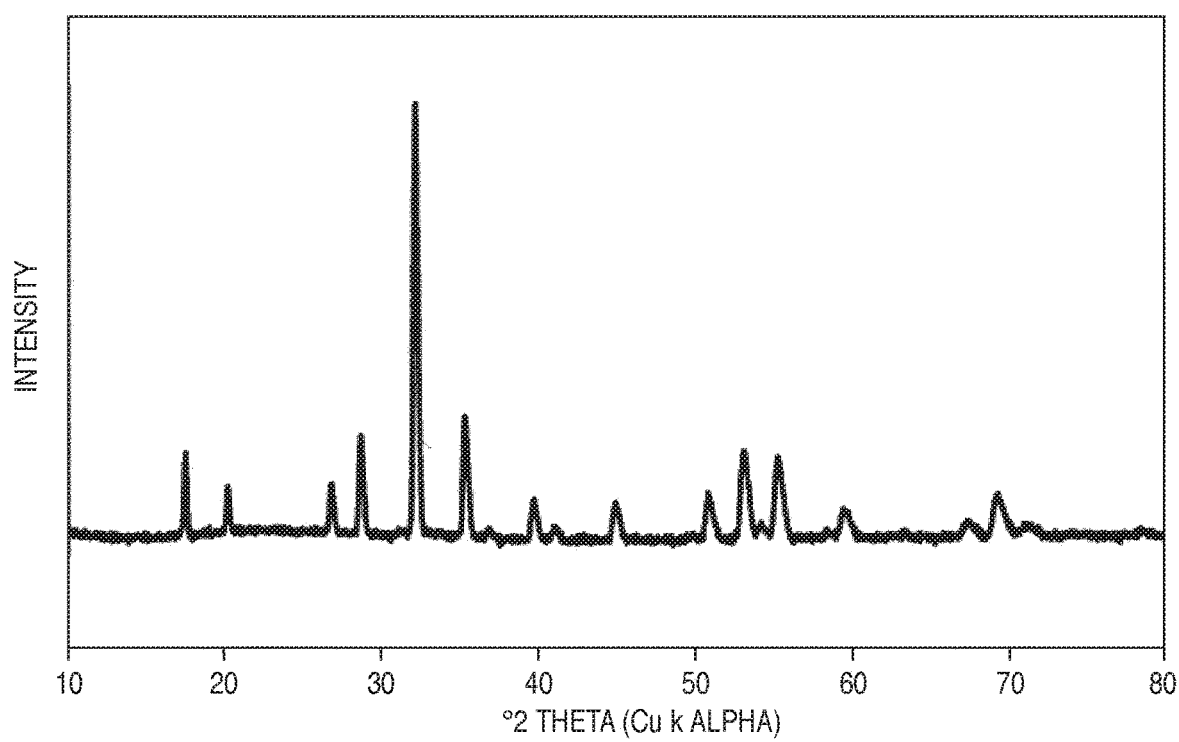
FIG. 8 is an XRD pattern of synthesized $Gd_{2.8}La_{0.2}Sc_{1.7}Lu_{0.2}Ga_3O_{12}:Cr_{0.1}$.

The starting materials 5.148 g gadolinium oxide (Rhodia, superamic grade), 1.189 g scandium oxide (Alfa Aesar, 4N), 0.404 g luthetium oxide (Rhodia), 2.852 g gallium oxide (Alfa Aesar, 4N), 0.0771 g chromium (III) oxide (Alfa, 99%), 0.3305 g lanthanum oxide (Auer Remy, 4N) and 0.2 g barium fluoride (Alfa Aesar) are mixed and fired at 1500° C. for 4 h in air atmosphere. After crushing and ball milling, the powder is washed in hot water, dried and sieved. FIG. 8 is an XRD pattern of the synthesized $Gd_{2.8}La_{0.2}Sc_{1.7}Lu_{0.2}Ga_3O_{12}:Cr_{0.1}$, crystallizing in the garnet structure with $a_0=12.440$ Å.

4. Synthesis of $Gd_{2.4}La_{0.6}Sc_{1.5}Lu_{0.4}Ga_3O_{12}:Cr_{0.1}$.

Figure 9:
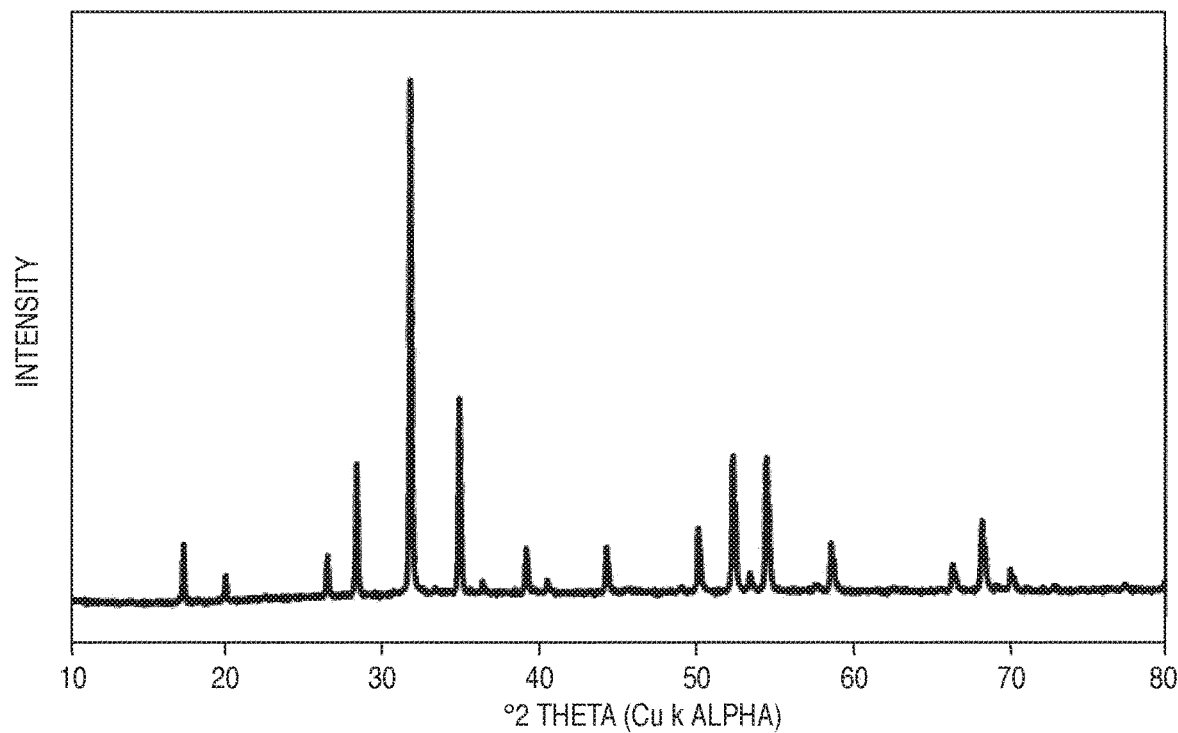
FIG. 9 is an XRD pattern of synthesized $Gd_{2.4}La_{06}Sc_{1.5}Lu_{04}Ga_3O_{12}:Cr_{0.1}$.

The starting materials 4.330 g gadolinium oxide (Rhodia, superamic grade), 1.103 g scandium oxide (Alfa Aesar, 4N), 0.792 g luthetium oxide (Rhodia), 2.799 g gallium oxide (Alfa Aesar, 4N), 0.0757 g chromium (III) oxide (Alfa, 99%), 0.9730 g lanthanum oxide (Auer Remy, 4N) and 0.2 g barium fluoride (Alfa Aesar) are mixed and fired at 1550° C. for 4 h in air atmosphere. After milling the powder is fired again for 4 hrs. at 1400° C. in a carbon monoxide atmosphere. After crushing and ball milling, the powder is washed in hot water, dried and sieved. FIG. 9 is an XRD pattern of the synthesized $Gd_{2.4}La_{0.6}Sc_{1.5}Lu_{0.4}Ga_3O_{12}:Cr_{0.1}$, crystallizing in the garnet structure with $a_0=12.604$ Å.

4.1. Synthesis of $Gd_{2.85}Sc_{1.75}Lu_{0.3}Ga_3O_{12}:Cr_{0.1}$.

Figure 15:
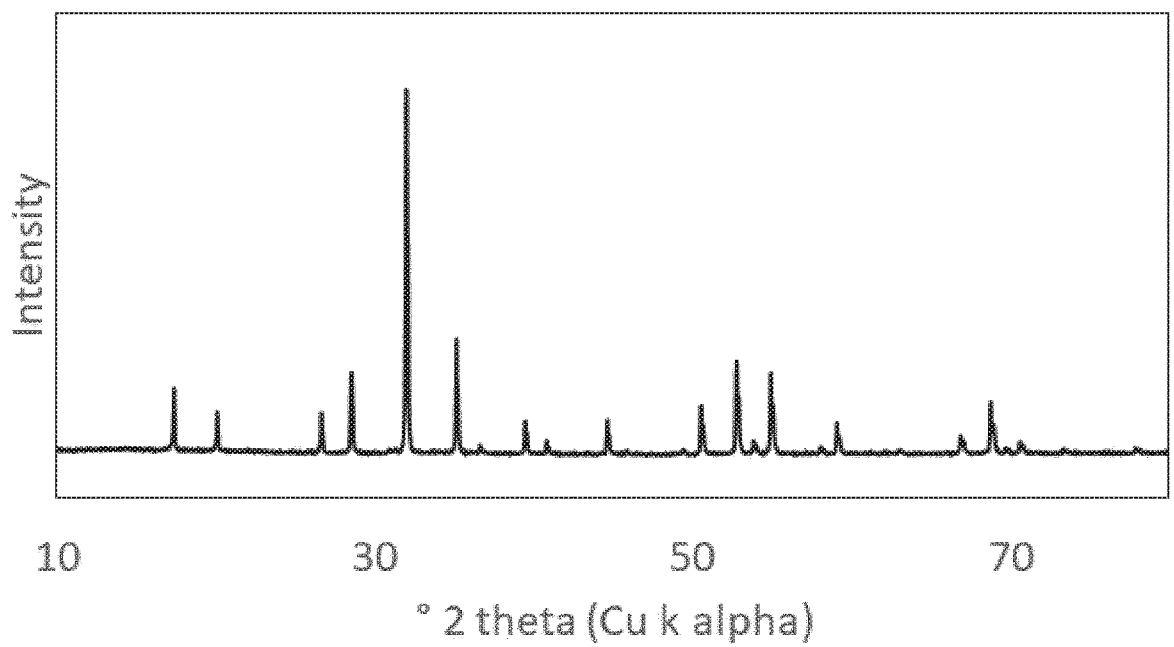
FIG. 15 is an XRD pattern of the synthesized $Gd_{2.85}Sc_{1.75}Lu_{0.3}Ga_3O_{12}:Cr_{0.1}$.

The starting materials 61.404 g gadolinium oxide (Treibacher, >3N8), 14.888 g scandium oxide (Treibacher, 4N), 7.291 g luthetium oxide (Solvay, 4N), 34.638 g gallium oxide (Dowa, 4N) 0.925 g chromium (III) oxide (Materion, >2N5) and 1.956 g gadolinium fluoride (Materion, >2N) are mixed by means of ball milling, and fired twice at 1550° C. and 1520° C. with intermediate milling for 8 hrs. After crushing, milling and washing with water, the powders are dried and sieved. FIG. 15 is an XRD pattern of the synthesized $Gd_{2.85}Sc_{1.75}Lu_{0.3}Ga_3O_{12}:Cr_{0.1}$, crystallizing in the garnet structure with $a_0=12.503$ Å.

5. Synthesis of $SrLiAl_{0.995}F_6:Cr_{0.005}$.

The starting materials $AlF_3$ (99.99%, anhydrous), LiF (99.999%), $SrF_2$ (99.99%, dry) and $CrF_3$ (99.98%, anhydrous) are mixed under argon and transferred in a platinum crucible. After firing at 600° C. for 4 hrs. under argon atmosphere, the resulting powder cake is milled under ethanol and dried.

6. Phosphor Mixtures.

For infrared illumination applications like NIR spectroscopy it is often preferable to have a broad, continuous emission intensity distribution. Accordingly, in some embodiments, one or more longer wavelength emitting materials, for example from the class of Cr doped calcium gallogermanate type phosphors illustrated by e.g. examples 1), 2), and 2.1), is combined with one or more shorter wavelength emitting materials, for example from the class of Cr doped garnets illustrated by e.g. examples 3), 4), and 4.1), and/or with materials from the class of Cr doped colquiirite materials illustrated by e.g. example 5).

Figure 10:
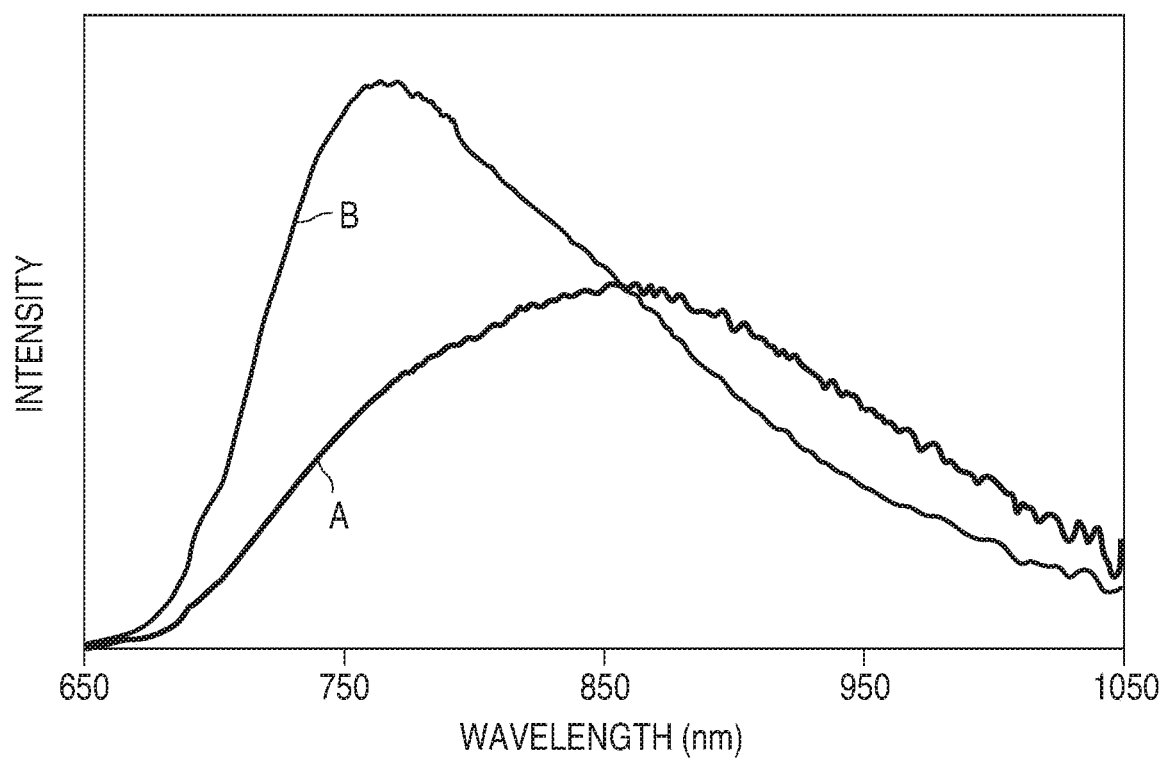
FIGS. 10 and 11 illustrate the emission spectra of mixtures of longer wavelength and shorter wavelength near infrared emitting materials.
Figure 11:
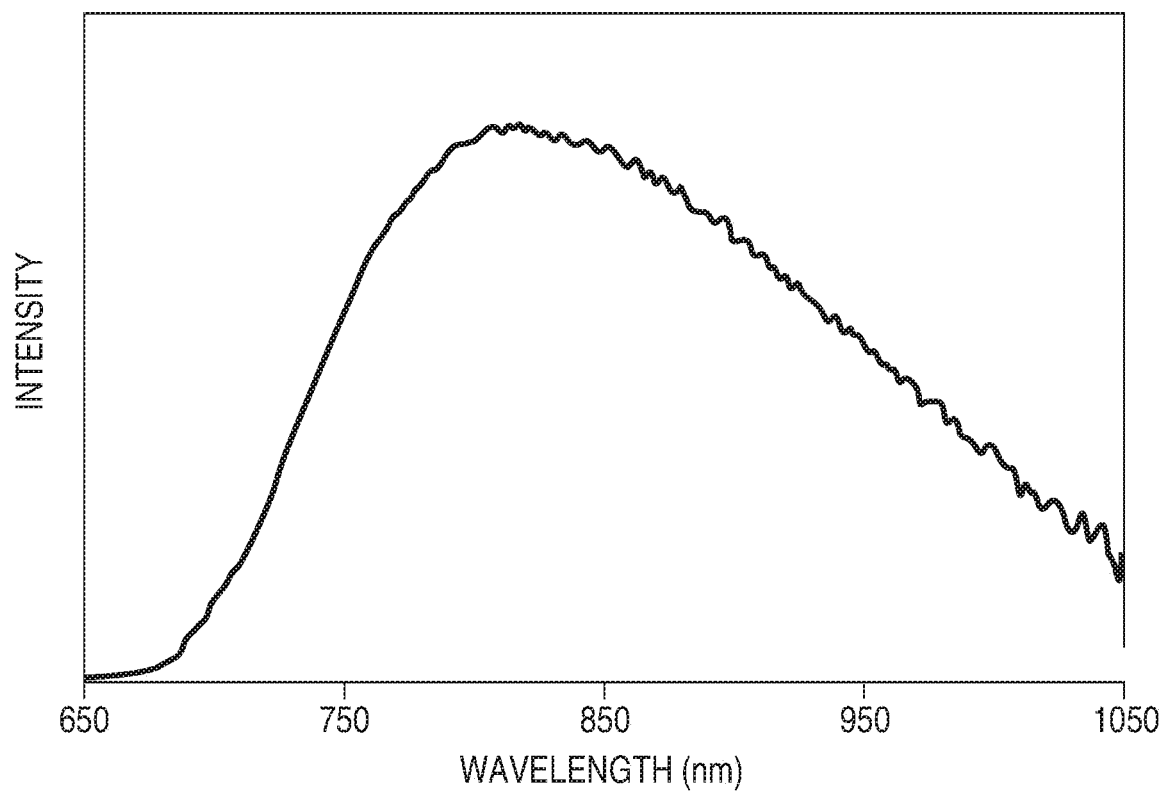

FIGS. 10 and 11 show examples of emission spectra obtained from such phosphor mixtures when excited with 445 nm light. In FIG. 10, curve A is the emission spectrum of a mixture of $La_3Ga_{4.98}SiO_{14}:Cr_{0.02}$ and $Gd_{2.8}La_{0.2}Sc_{1.7}Lu_{0.2}Ga_3O_{12}:Cr_{0.1}$ mixed at a ratio of 5:1 (weight/weight). Curve B is the emission spectrum of a mixture of $La_3Ga_{4.98}SiO_{14}:Cr_{0.02}$ and $Gd_{2.8}La_{0.2}Sc_{1.7}Lu_{0.2}Ga_3O_{12}:Cr_{0.1}$ mixed at a ratio of 2:1

(weight/weight). FIG. 11 illustrates the emission spectrum of a mixture of $La_3Ga_{4.98}SiO_{14}:Cr_{0.02}$ and $SrLiAl_{0.995}F_6:Cr_{0.005}$. mixed at a ratio of 4:1 (weight/weight). The combination of at least two different phosphor systems may enable a broad composed emission spectrum in the 700-1100 nm range with superior conversion efficiency compared to a single phosphor system spectrum, especially at elevated temperatures 7. LED Evaluation.

Figure 12:
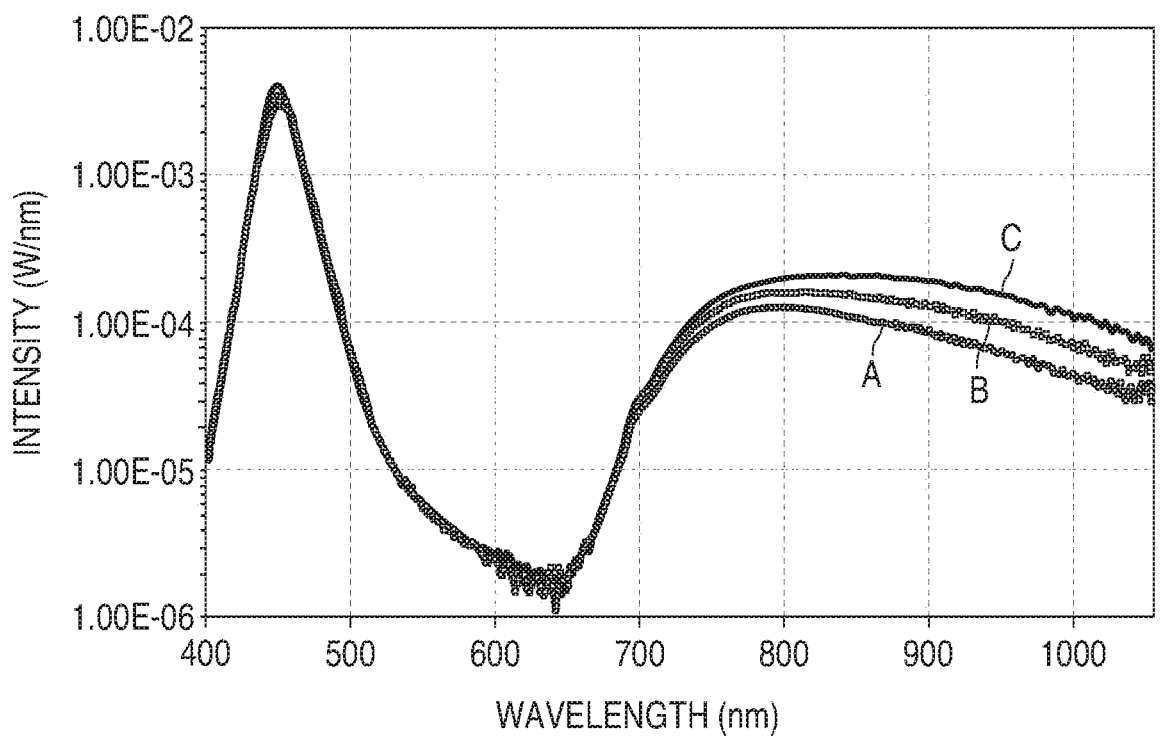
FIGS. 12 and 13 illustrate the emission spectra of phosphor converted LEDs including mixtures of longer wavelength and shorter wavelength near infrared emitting materials.
Figure 13:
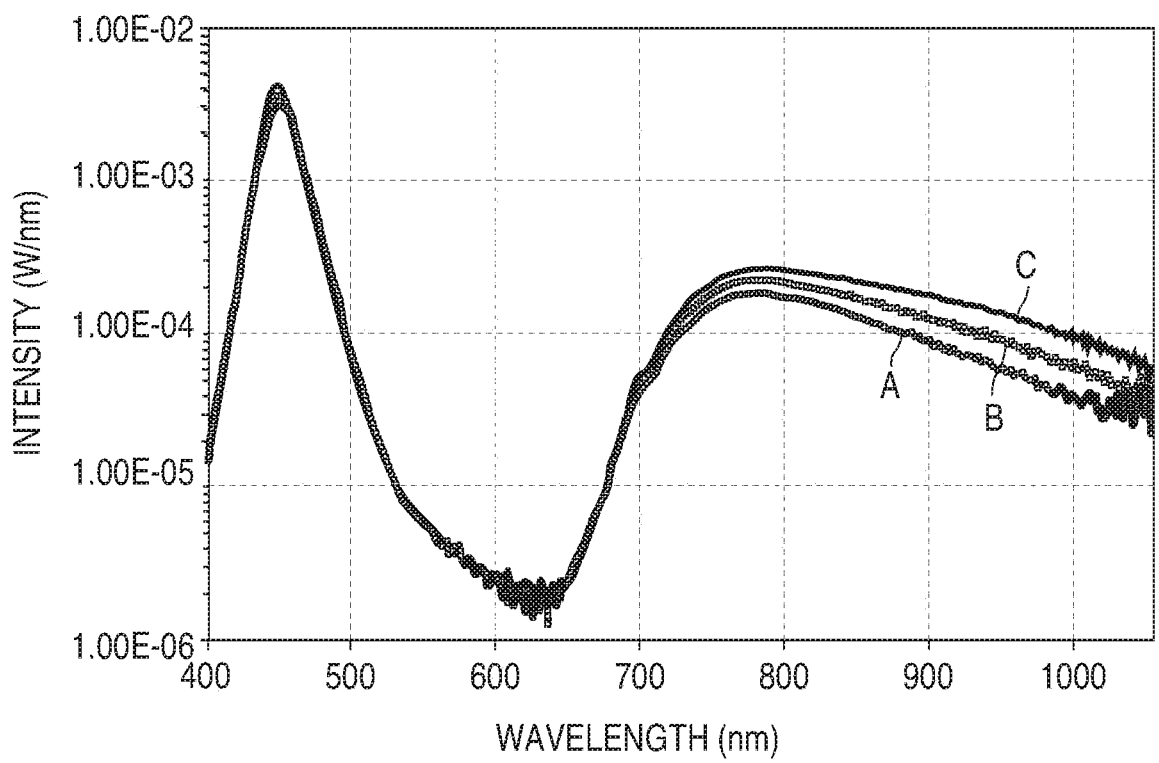

The phosphor powder of example 1) with a density of 5.52 g/cm$^3$ and example 3) with a density of 6.80 g/cm$^3$ were suspended, in weight ratios of 90:10 and 95:5, in silicone (Dow Corning OE-7662). The suspension was dispensed with a needle dispenser into a package equipped with 450 nm emitting blue InGaN pump LEDs. After curing the silicone, the phosphor-converted LEDs were measured at different temperatures, as illustrated in FIGS. 12 and 13. For a pulse current of e.g. 350 mA, a total radiant flux >50 mW was obtained for the 600-1050 nm range.

FIG. 12 illustrates the emission spectra of a phosphor converted LED including a mixture of 5 wt % $Gd_{2.8}La_{0.2}Sc_{1.7}Lu_{0.2}Ga_3O_{12}:Cr_{0.1}$ and 95 wt % $La_3Ga_{4.98}SiO_{14}:Cr_{0.02}$ dispensed in a package with a 450 nm blue pump LED for I=350 mA, 20 ms pulse length. Curve A is the emission spectrum at 25° C. (LED board temperature), where the device emits a total radiant flux of 53 mW for the 600-1050 nm range. Curve B is the emission spectrum at 55° C., where the device emits a total radiant flux of 39 mW for the 600-1050 nm range. Curve C is the emission spectrum at 85° C., where the device emits a total radiant flux of 28 mW for the 600-1050 nm range.

FIG. 13 illustrates the emission spectra of a phosphor converted LED including a mixture of 10 wt % $Gd_{2.8}La_{0.2}Sc_{1.7}Lu_{0.2}Ga_3O_{12}:Cr_{0.1}$ and 90 wt % $La_3Ga_{4.98}SiO_{14}:Cr_{0.02}$ dispensed in a package with a 450 nm blue pump LED for I=350 mA, 20 ms pulse length. Curve A is the emission spectrum at 25° C. (LED board temperature), where the device emits a total radiant flux of 64 mW for the 600-1050 nm range. Curve B is the emission spectrum at 55° C., where the device emits a total radiant flux of 49 mW for the 600-1050 nm range. Curve C is the emission spectrum at 85° C., where the device emits a total radiant flux of 38 mW for the 600-1050 nm range.

Figure 16:
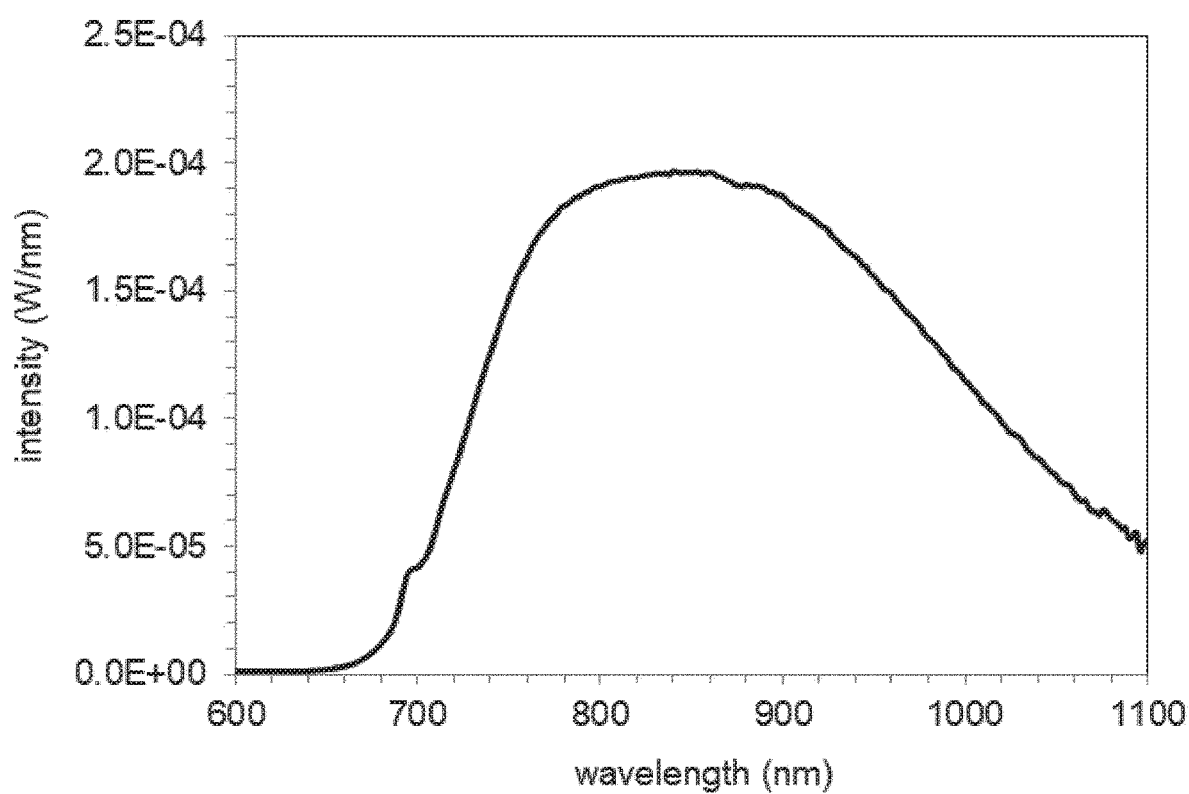
FIG. 16 illustrates the emission spectra of a phosphor converted LED including a mixture of 12 wt % $Gd_{2.85}Sc_{1.75}Lu_{0.3}Ga_3O_{12}:Cr_{0.1}$ and 88 wt % $La_{2.98}Gd_{0.02}Ga_{4.76}Al_{0.2}SiO_{14}:Cr_{0.04}$.

The phosphor powder of example 2.1) with a density of 5.752 g/cm$^3$ and example 3) with a density of 6.803 g/cm$^3$ were suspended, in a weight ratio of 88:12, in silicone (24.7 vol % phosphor load). The suspension was dispensed with a needle dispenser into a package equipped with 450 nm emitting blue InGaN pump LEDs. After curing the silicone, the phosphor-converted LEDs were measured at room temperature, as illustrated in FIG. 16. For a pulse current of e.g. 350 mA, a total radiant flux >50 mW was obtained for the 600-1100 nm range.

FIG. 16 illustrates the emission spectra of a phosphor converted LED including a mixture of 12 wt % $Gd_{2.85}Sc_{1.75}Lu_{0.3}Ga_3O_{12}:Cr_{0.1}$ and 88 wt % $La_{2.98}Gd_{0.02}Ga_{4.76}Al_{0.2}SiO_{14}:Cr_{0.04}$ dispensed in a package with a 450 nm blue pump LED for I=350 mA, 20 ms pulse length at 25° C. (LED board temperature), where the device emits a total radiant flux of 57 mW for the 600-1100 nm range.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A luminescent material, comprising:
    a host lattice crystallizing in a trigonal calcium gallogermanate structure type; and
    dopants disposed in the host lattice, the dopants comprising:
        trivalent chromium; and
        tetravalent chromium in a concentration that is less than 1% of a total concentration of all chromium in the luminescent material.

2. The luminescent material of claim 1, wherein the host lattice comprises a tetravalent cation with an effective atomic radius at least 10% smaller than an effective ionic radius of Cr(IV).

3. The luminescent material of claim 1, wherein the luminescent material is $RE_3Ga_{5-x-y}A_xSiO_{14}:Cr_y$ (RE=La, Nd, Gd, Yb, Tm; A=Al, Sc), where $0 \le x \le 1$ and $0.005 \le y \le 0.1$.

4. The luminescent material of claim 1, wherein the host lattice is $La_3Ga_{5-x}SiO_{14}$.

5. The luminescent material of claim 1, wherein the luminescent material emits light within a 700-1100 nm range.

6. The luminescent material of claim 1, wherein the luminescent material is $(La,Gd)_3Ga_{5-x-y}Al_xSiO_{14}:Cr_y$, where $0 \le x \le 1$ and $0.02 \le y \le 0.08$.

7. The luminescent material of claim 6, wherein the luminescent material is excited by blue or red light.

8. The luminescent material of claim 1 wherein the luminescent material has a full width at half maximum between 1700 cm$^{-1}$ and 4000 cm$^{-1}$.

9. The luminescent material of claim 6, wherein the band gap of the luminescent material is at least 4.8 eV.

10. The luminescent material of claim 1 wherein the luminescent material is $La_{2.98}Gd_{0.02}Ga_{4.76}Al_{0.2}SiO_{14}:Cr_{0.04}$.

11. The luminescent material of claim 6 wherein the luminescent material has a full width at half maximum between 1700 cm$^{-1}$ and 4000 cm$^{-1}$.

12. The luminescent material of claim 6, wherein the luminescent material is $La_{2.98}Gd_{0.02}Ga_{4.76}Al_{0.2}SiO_{14}:Cr_{0.04}$.

13. A device comprising:
    a light source;
    the luminescent material of claim 1; and
    a second luminescent material crystallizing in the cubic garnet structure type.

14. The device of claim 13 wherein the first luminescent material is $RE_3Ga_{5-x-y}A_xSiO_{14}:Cr_y$ (RE=La, Nd, Gd, Yb, Tm; A=Al, Sc), where $0 \le x \le 1$ and $0.005 \le y \le 0.1$.

15. The device of claim 13, wherein the second luminescent material is:
    $Gd_{3-x}RE_xSc_{2-y-z}Ln_yGa_{3-w}Al_wO_{12}:Cr_z$ (Ln=Lu, Y, Yb, Tm; RE=La, Nd), where $0 \le x \le 3$; $0 \le y \le 1.5$; $0 \le z \le 0.3$; and $0 \le w \le 2$;
    $AAEM_{1-x}F_6:Cr_x$ (A=Li, Cu; AE=Sr, Ca; M=Al, Ga, Sc) where $0.005 \le x \le 0.2$; or
    $A_{2-x}(WO_4)_3:Cr_x$ (A=Al, Ga, Sc, Lu, Yb) where $0.003 \le x \le 0.5$.

16. The device of claim 13, wherein:
    the first luminescent material is $(La,Gd)_3Ga_{5-x-y}Al_x SiO_{14}:Cr_y$, where $0 \le x \le 1$ and $0.02 \le y \le 0.08$; and
    the second luminescent material is $Gd_{3-x1}Sc_{2-x2-y}Lu_{x1+x2}Ga_3O_{12}:Cr_y$, where $0.02 \le x1 \le 0.25$, $0.05 \le x2 \le 0.3$ and $0.04 \le y \le 0.12$.

17. The device of claim 13, wherein:
the first luminescent material is $La_{2.98}Gd_{0.02}Ga_{4.76}Al_{0.2}SiO_{14}:Cr_{0.04}$; and
the second luminescent material is $Gd_{2.85}Sc_{1.75}Lu_{0.3}Ga_3O_{12}:Cr_{0.1}$.

* * * * *